(12) United States Patent
Haralabidis et al.

(10) Patent No.: US 9,148,233 B2
(45) Date of Patent: *Sep. 29, 2015

(54) METHOD AND SYSTEM FOR COEXISTENCE IN A MULTIBAND, MULTISTANDARD COMMUNICATION SYSTEM UTILIZING A PLURALITY OF PHASE LOCKED LOOPS

(75) Inventors: Nikolaos Haralabidis, Athens (GR);
Ioannis Kokolakis, Holargos (GR);
Nikolaos Kanakaris, Athens (GR);
Konstantinos Vavelidis, Ilioupolis (GR)

(73) Assignee: Broadcom Corporation, Irvine, CA (US)

(*) Notice: Subject to any disclaimer, the term of this patent is extended or adjusted under 35 U.S.C. 154(b) by 223 days.

This patent is subject to a terminal disclaimer.

(21) Appl. No.: 13/614,113

(22) Filed: Sep. 13, 2012

(65) Prior Publication Data
US 2013/0029613 A1 Jan. 31, 2013

Related U.S. Application Data

(63) Continuation of application No. 13/399,577, filed on Feb. 17, 2012, now Pat. No. 8,559,767, which is a continuation of application No. 12/325,750, filed on Dec. 1, 2008, now Pat. No. 8,121,573.

(60) Provisional application No. 61/088,052, filed on Aug. 12, 2008.

(51) Int. Cl.
*H03L 7/18* (2006.01)
*H04B 15/06* (2006.01)
*H04B 1/04* (2006.01)

(52) U.S. Cl.
CPC .............. *H04B 15/06* (2013.01); *H04B 1/0475* (2013.01); *H03L 7/18* (2013.01)

(58) Field of Classification Search
CPC ......... H03L 7/099; H03L 7/18; H04W 24/02; H04W 24/04
USPC ..................... 455/73, 260; 375/219
See application file for complete search history.

(56) References Cited

U.S. PATENT DOCUMENTS

| | | | |
|---|---|---|---|
| 5,950,115 A * | 9/1999 | Momtaz et al. ................. 455/73 |
| 6,646,953 B1 * | 11/2003 | Stark ........................ 365/233.14 |
| 8,121,573 B2 | 2/2012 | Haralabidis et al. |
| 8,145,139 B2 | 3/2012 | Goldberg |
| 2007/0066272 A1 | 3/2007 | Vassiliou et al. |
| 2007/0207760 A1 | 9/2007 | Kavadias et al. |
| 2012/0236766 A1 | 9/2012 | Haralabidis et al. |

* cited by examiner

*Primary Examiner* — John Poos
(74) *Attorney, Agent, or Firm* — Sterne, Kessler, Goldstein & Fox PLLC

(57) ABSTRACT

Methods and systems for coexistence in a multiband, multistandard communication system utilizing a plurality of phase locked loops (PLLs) are disclosed. Aspects may include determining one or more desired frequencies of operation of a transceiver, determining a frequency of unwanted signals such as spurs, intermodulation, and/or mixing product signals, and configuring the Plls to operate at a multiple of the desired frequencies while avoiding the unwanted signals. The desired frequencies may be generated utilizing integer, which may include multi-modulus dividers. The wireless standards may include LTE, GSM, EDGE, GPS, Bluetooth, WiFi, and/or WCOMA, for example. The frequencies may be configured to mitigate interference. Plls may be shared when operating in TOO mode, and used separately operating in FOO mode. One or more digital interface signals, zero exceptions on a transmitter spur emission mask, and sampling clocks for AOCs and/or DACs in the transceiver may be generated utilizing the PLLs.

20 Claims, 11 Drawing Sheets

METHOD AND SYSTEM FOR COEXISTENCE IN A MULTIBAND, MULTISTANDARD COMMUNICATION SYSTEM UTILIZING A PLURALITY OF PHASE LOCKED LOOPS

CROSS-REFERENCE TO RELATED APPLICATIONS/INCORPORATION BY REFERENCE

This application is a continuation of U.S. Non-Provisional Application Ser. No. 13/399,557, filed Feb. 17, 2012, which is a continuation of U.S. Non-Provisional application Ser. No. 12/325,750, issued as U.S. Pat. No. 8,121,573 on Feb. 21, 2012. U.S. Non-Provisional application Ser. No. 13/399,557 makes reference to, claims priority to, and claims the benefit of U.S. Provisional Application Ser. No. 61/088,052 filed on Aug. 12, 2008, all of which are hereby incorporated by reference in their entirety.

This application also makes reference to:
U.S. patent application Ser. No. 12/325,715 filed on Dec. 1, 2008;
U.S. patent application Ser. No. 12/427,564 filed on Apr. 21, 2009; and
U.S. patent application Ser. No. 12/325,771 filed on Dec. 1, 2008, issued as U.S. Pat. No. 8,135,430.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for coexistence in a multiband, multistandard communication system utilizing a plurality of phase locked loops.

BACKGROUND OF THE INVENTION

Mobile communications have changed the way people communicate and mobile phones have been transformed from a luxury item to an essential part of everyday life. The use of mobile phones today is dictated by social situations, rather than hampered by location or technology. While voice connections fulfill the basic need to communicate, and mobile voice connections continue to filter even further into the fabric of every day life, various integrated mobile multimedia applications, utilizing the mobile Internet, may be the next step in the mobile communication revolution.

Third generation (3G) cellular networks offering various high speed access technologies and mobile telephones that have been specifically designed to utilize these technologies, fulfill demands for integrated multimedia applications supporting TV and audio applications utilizing advanced compression standards, high-resolution gaming applications, musical interfaces, and peripheral interface support. The processing requirements are being increased as chip designers take advantage of compression and higher bandwidths to transmit more information. 3G wireless applications support bit rates from 384 kilobits (Kbits)/second to 2 megabits (Mbits)/second, allowing chip designers to provide wireless systems with multimedia capabilities, superior quality, reduced interference, and a wider coverage area.

As mobile multimedia services grow in popularity and usage, factors such as power consumption, cost efficient optimization of network capacity and quality of service (QoS) will become even more essential to cellular operators than it is today. These factors may be achieved with careful network planning and operation, improvements in transmission methods, and advances in receiver techniques and chip integration solutions. To this end, carriers need technologies that will allow them to increase downlink throughput for the mobile multimedia applications support and, in turn, offer advanced QoS capabilities and speeds for consumers of mobile multimedia application services.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for coexistence in a multiband, multistandard communication system utilizing a plurality of phase locked loops, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEW OF THE DRAWINGS

DETAILED DESCRIPTION OF THE INVENTION

Certain embodiments of the invention may be found in a method and system for coexistence in a multiband, multistandard communication system utilizing a plurality of phase locked loops. Exemplary aspects of the invention may comprise determining one or more desired frequencies of operation of the wireless transmitter and wireless receiver. A frequency of one or more spurs and/or intermodulation/mixing product signals may be determined, and based on the determination, a plurality of phase locked loops may be configured to operate such as to avoid or eliminate one or more spurs, intermodulation, and/or mixing product signals. The desired frequencies of operation may be generated utilizing programmable dividers, which may comprise multi-modulus dividers (MMDs). The wireless standards in the multi-band, multi-standard wireless transmitter and wireless receiver comprise LTE, GSM, EDGE, GPS, Bluetooth, WiFi, and/or WCDMA, for example. The desired frequencies of operation may be configured to mitigate interference between the wireless standards. Phase locked loops may be shared when the wireless transmitter and wireless receiver operate in time-division duplex mode, and separate or a combination of phase locked loops may be utilized when the wireless transmitter and wireless receiver operate in frequency-division duplex mode. Zero exceptions may result on a transmitter spur emission mask utilizing the plurality of phase locked loops. A plurality of sampling and/or ancillary clocks may be generated utilizing one or more of the plurality of phase locked loops for analog to digital converters, digital to analog converters, digital signal processing blocks, and/or digital data communication interfaces, such as DigRFv4 interfaces, for example, in the wireless multi-band, multi-standard wireless transmitter and wireless receiver.

Figure 1:
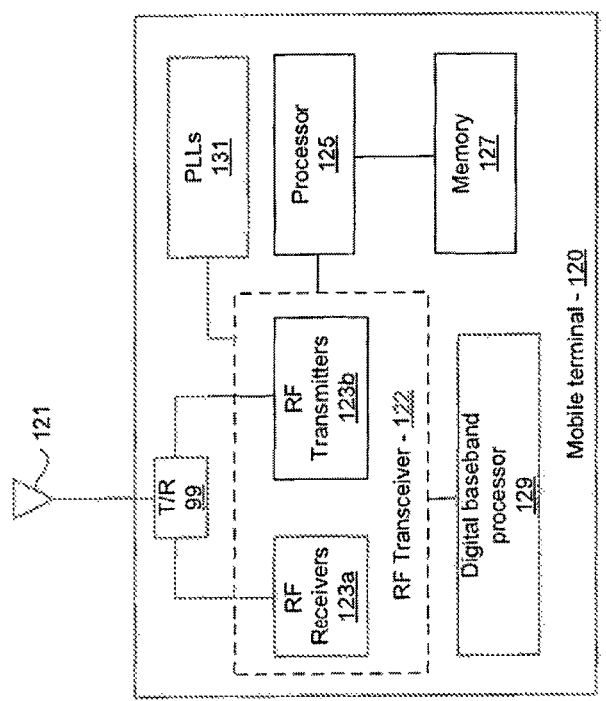
FIG. 1 is a block diagram of an exemplary mobile terminal that may enable coexistence in a multi-band, multi-standard communication system utilizing a plurality of phase locked loops, in accordance with an embodiment of the invention.

FIG. 1 is a block diagram of an exemplary mobile terminal that may utilize a variable system on demand, in accordance with an embodiment of the invention. Referring to FIG. 1, there is shown a wireless terminal 120 that may comprise an RF receiver 123a, an RF transmitter 123b, a digital baseband processor 129, PLLs 131, a processor 125, and a memory 127. The wireless terminal 120 may enable communication via a cellular network (GSM/EDGE, WCDMA and/or LTE), a wireless local area network (WLAN) and a Bluetooth network, and may be enabled to receive and process GPS signals. In an embodiment of the invention, the RF receiver 123a and the RF transmitter 123b may be integrated into a single RF transceiver 122, for example. The RF receiver 123a and the RF transmitter 123b may be integrated into a single chip that comprises a cellular radio (GSM/EDGE, WCDMA and/or LTE), WLAN radio and a Bluetooth radio, for example. The single chip comprising cellular, WLAN and Bluetooth radios may be implemented utilizing a single CMOS substrate, for example.

One or more transmit and receive antennas, shown schematically by the antenna 121, may be communicatively coupled to the RF receiver 123a and the RF transmitter 123b. In this regard, the antenna 121 may enable WLAN and Bluetooth transmission and/or reception, for example. A switch or other device having switching capabilities may be coupled between the RF receiver 123a and RF transmitter 123b, and may be utilized to switch the antenna 121 between transmit and receive functions in instances where a single antenna may be used to transmit and receive. The wireless terminal 120 may be operated in a system, such as a Wireless Local Area Network (WLAN), a cellular network, such as Long Term evolution (LTE), W-CDMA, and/or GSM, a digital video broadcast network, and/or a Wireless Personal Area Network (WPAN) such as a Bluetooth network, for example. In this regard, the wireless terminal 120 may support a plurality of wireless communication protocols, including the IEEE 802.11g/n standard specifications for WLAN networks.

The RF receiver 123a may comprise suitable logic, circuitry, and/or code that may enable processing of received RF signals. The RF receiver 123a may enable receiving RF signals in a plurality of frequency bands in accordance with the wireless communications protocols that may be supported by the wireless terminal 120. Each frequency band supported by the RF receiver 123a may have a corresponding front-end circuit for handling low noise amplification and down conversion operations, for example. In this regard, the RF receiver 123a may be referred to as a multi-band receiver when it supports more than one frequency band. In another embodiment of the invention, the wireless terminal 120 may comprise more than one RF receiver 123a, wherein each of the RF receiver 123a may be a single-band or a multi-band receiver. The RF receiver 123a may be implemented on a chip. In an embodiment of the invention, the RF receiver 123a may be integrated with the RF transmitter 123b on a chip to comprise an RF transceiver, for example. In another embodiment of the invention, the RF receiver 123a may be integrated on a chip with more than one component in the wireless terminal 120.

The RF receiver 123a may quadrature down convert the received RF signal to a baseband frequency signal that comprises an in-phase (I) component and a quadrature (Q) component. The RF receiver 123a may perform direct down conversion of the received RF signal to a baseband frequency signal, for example. In some instances, the RF receiver 123a may enable analog-to-digital conversion of the baseband signal components before transferring the components to the digital baseband processor 129. In other instances, the RF receiver 123a may transfer the baseband signal components in analog form.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b, when the RF transmitter 123b is present, for transmission to the network. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network. In an embodiment of the invention, the digital baseband processor 129 may be integrated on a chip with more than one component in the wireless terminal 120.

The RF transmitter 123b may comprise suitable logic, circuitry, and/or code that may enable processing of RF signals for transmission. The RF transmitter 123b may enable transmission of RF signals in a plurality of frequency bands. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the wireless terminal 120 may comprise more than one RF transmitter 123b, wherein each of the RF transmitter 123b may be a single-band or a multi-band transmitter. The RF transmitter 123b may be implemented on a chip. In an embodiment of the invention, the RF transmitter 123b may be integrated with the RF receiver 123a on a chip to comprise an RF transceiver, for example. In another embodiment of the invention, the RF transmitter 123b may be integrated on a chip with more than one component in the wireless terminal 120.

The RF transmitter 123b may quadrature up convert the baseband frequency signal comprising I/Q components to an RF signal. The RF transmitter 123b may perform direct up conversion of the baseband frequency signal to a baseband frequency signal, for example. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the wireless terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the wireless terminal 120. The processor 125 may also enable executing of applications that may be utilized by the wireless terminal 120. For example, the processor 125 may generate at least one control signal and/or may execute applications that may enable current and proposed WLAN communications and/or Bluetooth communications in the wireless terminal 120.

The memory 127 may comprise suitable logic, circuitry, and/or code that may enable storage of data and/or other information utilized by the wireless terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the wireless terminal 120. For example, the memory 127 may comprise information necessary to configure the RF receiver 123a for receiving WLAN and/or Bluetooth signals in the appropriate frequency band.

The RF receiver 123a may comprise a low noise amplifier (LNA) that may be configurable for single-ended or differential mode. Similarly an on-chip balun may also be configurable for single-ended or differential mode. In this manner, the balun may be integrated on-chip as a load to the LNA, thereby improving the noise figure for the RF receiver 123a.

Aspects of the invention may enable supporting a plurality of wireless standards in a single integrated transceiver. In this regard, each of a transmit chain and a receive chain may be configurable to support Long Term evolution (LTE), W-CDMA, and GSM wireless standards. LTE technology capabilities may comprise orthogonal frequency division multiplexing (OFDM), multiple antenna (MIMO), bandwidth scalability, existing (I-XI) and new (XII-XIV) bands, FDD and TDD, for example. OFDM capability may provide robustness against multipath issues, ease of scheduling of time/frequency resources, and increased spectral efficiency.

MIMO technology may provide enhanced data rate and performance, and may comprise 1 Tx and 2 Rx antennas, for example. Bandwidth scalability may enable efficient operation in differently-size allocated spectrum bands which may comprise 1.4, 3, 5, 10, 15 and 20 MHz, for example.

Single carrier FDMA (SC-FDMA) may enable frequency domain generation (DFT-Spread OFDM) and scalable bandwidth and flexible scheduling. In an embodiment of the invention, SC-FDMA may utilize quantized phase shift keying (QPSK) and N-bit quantized amplitude modulation (N-QAM), for example.

Configurable components/portions of the RF receivers 123a may comprise LNA(s), mixer(s), RF filter(s), PLL(s), VCO(s), ADC(s), and baseband filter(s). The receive chain may be configured to optimize power consumption for a given standards (LTE, W-CDMA, GSM) and conditions (e.g. interference, signal strength).

Configurable components/portions of the RF transmitters 123b may comprise PA(s), mixer(s), RF filter(s), PLL(s), VCO(s), DAC(s), and baseband filter(s). The transmit chain may be configured to optimize power consumption for a given standard (LTE, W-CDMA, GSM) and condition (e.g. interference, signal strength). An exemplary way in which the transmit chain may be configured is to select between IQ modulation or polar modulation, for optimum signal strength or power usage, for example.

Since each supported communication standard may comprise different filtering requirements, the baseband filter or filters may be configured to enable communication by any of the supported standards. For example, for GSM a Butterworth filter may be utilized, for W-CDMA, a Chebyschev filter of 0.3 dB ripple may be utilized, and in LTE, a Chebyschev filter with 1 dB ripple may be utilized. Furthermore, the filter bandwidth requirements may be different. For GSM the bandwidth may be up to 300 kHz, in wideband CDMA up to 2 MHz, and in LTE the bandwidth may vary from 0.7 MHz to 10 MHz. Thus, there may be a plurality of different filter types and a plurality of different filter cutoff frequencies in the filter. In an exemplary embodiment of the invention, there may be three different filter types and eight different filter cutoff frequencies in the filter.

In an embodiment of the invention, the wireless terminal 120 may be enabled to operate at a plurality of wireless frequency bands, and may comprise a plurality of PLL's utilized to provide LO signals at the plurality of frequencies while avoiding possible spurs, intermodulation, and/or mixing product signals. Accordingly, separate PLL's may be used for Tx and Rx functions to allow for greater versatility, for better accommodation of intermediate frequency requirements, to enable zero-exceptions on the Tx spur emission mask, and to handle coexistence issues with GPS, BT, WiFi, and cellular standards, for example.

Figure 2:
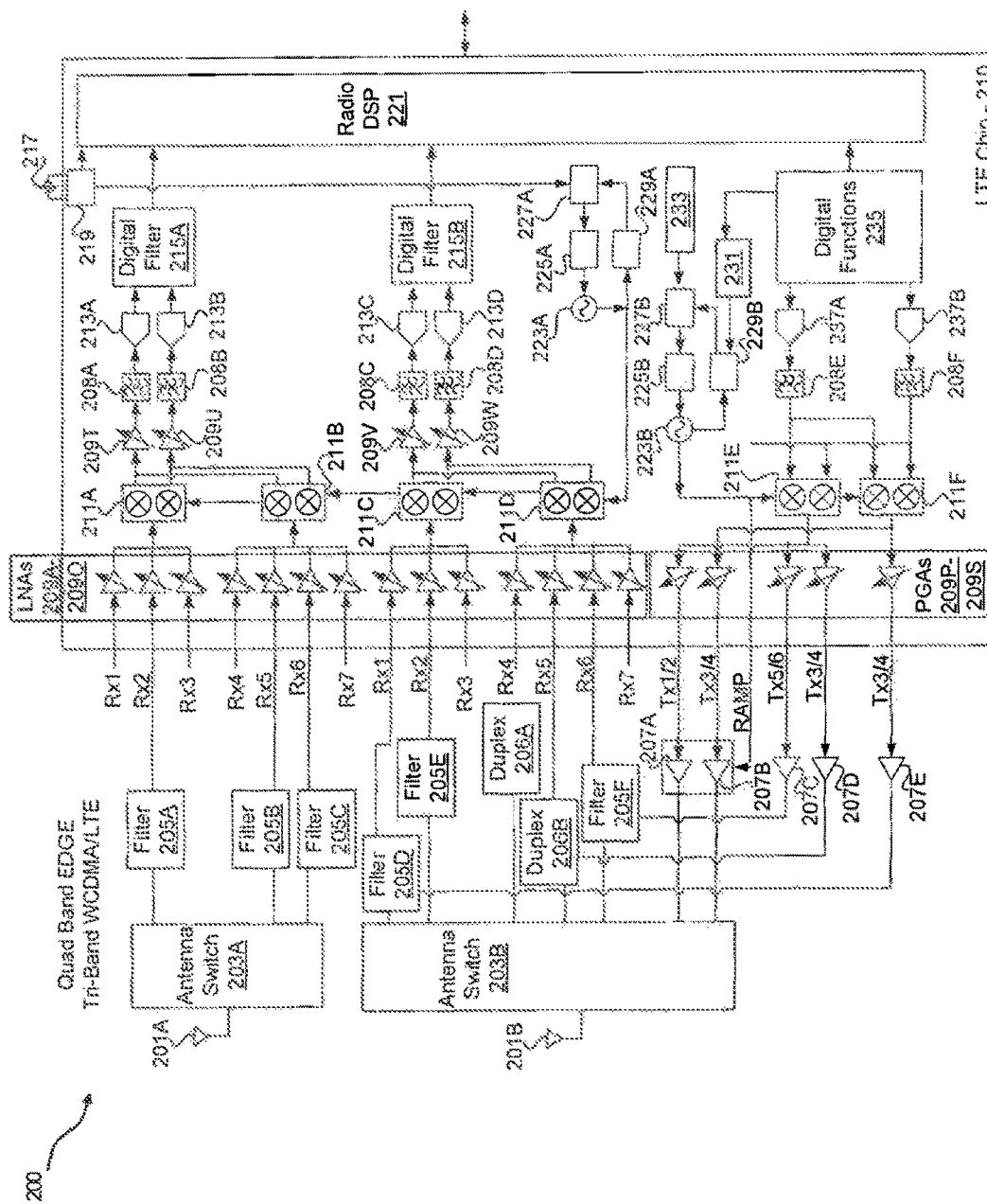
FIG. 2 is a block diagram illustrating an exemplary long term evolution (LTE) radio for enabling coexistence in a multiband, multi-standard communication system utilizing a plurality of phase locked loops, in accordance with an embodiment of the invention.

FIG. 2 is a block diagram illustrating an exemplary long term evolution (LTE) radio for enabling coexistence in a multiband, multistandard communication system utilizing a plurality of phase locked loops, in accordance with an embodiment of the invention. Referring to FIG. 2, there is shown an LTE radio platform 200 comprising an LTE chip 210, antennas 201A and 201B, antenna switches 203A and 203B, filters 205A-205H, duplexers 206A-206B, amplifiers 207A-207E, and a crystal oscillator 217. The LTE radio platform 200 may be integrated in a wireless mobile terminal, such as the wireless terminal 120, described with respect to FIG. 1.

The LTE chip 210 may comprise low noise amplifiers (LNAs) 209A-209N, RF PGAs 209O-209S, mixers 211A-211F, filters 208A-208F, analog to digital converters (ADCs) 213A-213D, digital filters 215A and 215B, a crystal oscillator control block 219, a radio DSP 221, voltage controlled oscillators (VCOs) 223A and 223B, low pass filters 225A and 225B, phase-frequency detector (PFD)/charge pump (CP) blocks 227A and 227B, multi-modulus dividers (MMDs) 229A and 229B, a phase modulator 231, a reference PLL 233, a digital functions block 235, and digital to analog converters (DACs) 237A and 237B.

The antennas 201A and 201B may comprise electromagnetic signal transmit and/or receive capability, and may be enabled to transmit or receive RF signals that may be processed by the LTE chip 210. The antenna switches 203A and 203B may comprise suitable circuitry, logic, and/or code that may enable the selection of a path to be transmitted from the LTE chip 210 and/or to communicate a received signal to the LTE chip 210.

The filters 205A-205F and the baseband filters 208A-208F may comprise suitable circuitry, logic, and/or code that may enable filtering a received signal. In this manner, a signal of a desired frequency may be communicated through the filters 205A-205F and the baseband filters 208A-208F, while signals outside the desired frequency range may be attenuated. The baseband filters 208A-208F may be configurable, comprising stages that may be switched on and off, and may also be frequency-configurable, thus enabling multiband, multistandard operation.

The duplexers 206A and 206B may comprise suitable circuitry, logic, and/or code that may enable simultaneous operation of Tx and Rx through a single path. The duplexers 206A and 206B may filter a Tx signal to the antenna and filter Rx signals from the antenna, and may also provide isolation between a chip comprising the Tx and Rx ports in a printed circuit board, for example.

The amplifiers 207A-207E may comprise suitable circuitry, logic, and/or code that may enable the amplification of a transmitted signal to a desired amplitude suitable for transmission via the antenna 201B. The low noise amplifiers (LNAs) 209A-208N may comprise suitable circuitry, logic, and/or code that may enable the amplification of a received signal, and may be configured to a desired gain level depending on the requirements of the standard being utilized for RF communication and desired noise figure. The RF PGAs 209O-209S may comprise suitable circuitry, logic, and/or code that may enable the amplification of a transmit signal to a desired amplitude suitable for driving the amplifiers 207A-207E and/or an interface to components external to the LTE chip 210.

The mixers 211A-211F may comprise suitable circuitry, logic, and/or code that may enable up-conversion of a baseband or intermediate frequency signal to an RF frequency and/or down-conversion from an RF frequency to an intermediate or baseband frequency. The mixers 211A-211F may receive as inputs a signal to be converted and a local oscillator signal that may enable frequency conversion via the generation of sum and difference signals with the undesired signal subsequently being filtered out, leaving a signal at a desired frequency.

The ADCs 213A-213D may comprise suitable circuitry, logic, and/or code that may be enabled to receive an analog signal and generate a digital output signal. The DACs 237A and 237B may comprise suitable circuitry, logic, and/or code that may be enabled to receive a digital signal and generate an analog output signal.

The digital filters 215A and 215B may comprise suitable circuitry, logic, and/or code that may enable channel match filtering, de-rotation, and/or digital filtering of a received signal in the digital domain. In this manner, undesired signals generated by the ADCs 213A and 213B may be removed before communicating a signal to the radio DSP 221.

The crystal oscillator 217 may comprise a crystal that oscillates at a characteristic frequency determined by the material in the crystal. The crystal oscillator control block 219 may comprise suitable circuitry, logic, and/or code that may control the crystal oscillator 217. The crystal oscillator control block 219 may receive a signal at a characteristic frequency from the crystal oscillator 217, amplify the signal, and communicate the amplified feedback signal back to the crystal oscillator 217. In this manner, a stable clock signal may be generated at the characteristic frequency of the crystal oscillator 217.

The radio DSP 221 may comprise suitable circuitry, logic, and/or code that may enable the processing of digital signals via arbitrary functionality defined by user preferences and/or programming. The digital signals may comprise baseband signals, for example, and may represent information to be transmitted via the antenna 201B and/or received by the antenna 201A.

The VCOs 223A and 223B may comprise suitable circuitry, logic, and/or code that may be enabled to generate an output signal at a desired frequency as defined by an input voltage. The frequency of oscillation may be configured by varying the input voltage.

The LPFs 225A and 225B may comprise suitable circuitry, logic, and/or code that may be enabled to filter out higher frequency signals while allowing lower frequency signals to pass. The LPFs 225A and 225B may comprise feedback loops in PLLs to enable error correction and frequency lock of the PLLs. The input signals to the PLLs may comprise the crystal oscillator 217 and the reference PLL 233, for example.

The PFD/CP blocks 227A and 227B may comprise suitable circuitry, logic, and/or code that may be enabled to generate an error signal from a reference signal and a feedback signal received from a frequency divider, such as the MMDs 229A and 229B. The error signal may be communicated to the LPFs 225A and 225B before being communicated to the VCOs 223A and 2238 to adjust the frequency generated.

The MMDs 229A and 229B may comprise suitable circuitry, logic, and/or code that may be enabled to divide the frequency of a signal received from the VCOs 223A or 223B. The divided frequency signal may be communicated to the PFD/CP blocks 227A and 227B to generate an error signal for frequency locking of the VCOs 223A and 223B.

The phase modulator 231 may comprise suitable circuitry, logic, and/or code that may be enabled to modulate the phase of a signal generated from a signal received from the digital functions block 235. In this manner, the phase of the LO signal generated by the VCO 223B may be configurable.

The reference PLL 233 may comprise suitable circuitry, logic, and/or code that be enabled to generate a signal at a desired frequency. The output signal may be communicated to the PFD/CP block 227B to provide a reference LO signal for configuring the VCO 223B.

The digital functions block 235 may comprise suitable circuitry, logic, and/or code that may perform specific digital functions on digital baseband signals before communicating them to the DACs 237A and 237B or the phase modulator 231. The digital functions may comprise, channel match filtering, cordic, and calibrations, for example.

In operation, the LTE radio platform 200 may comprise support for bands I through XIV and also additional standards such as HSPA+, HSPA, UMTS, and GSM/EDGE, for example. Additionally, a WCDMA/LTE system may support up to three bands using dedicated WCDMA/LTE Tx outputs or up to five bands, with multi-mode power amplifier (PA) support, for example. Similarly, the LTE radio platform 200 may also support quad-band GSM/EDGE transmit and receive, LTE/WCDMA diversity with 2Rx/1 Tx path, as well as FDD and TDD operation. In the Tx, bands V, VI, and VIII, may be supported, for example, with multi-mode outputs (GSM/EDGE/WCDMA on a single output) and also separate outputs. On the Rx side, new bands such as VII, XI, XIII, and XIV, for example, may also be supported with Rx diversity utilizing a single Rx VCO. Additionally, the Rx may enable linearity on demand, Tx leakage mitigation, and no Tx or Rx interstage filters or external LNAs. Similarly, reduced supply voltage may be enabled (2.3-2.5 V, for example) to support improved battery technology.

In an embodiment of the invention, the LTE radio platform 200 may be enabled to operate at a plurality of wireless frequency bands, and may comprise a plurality of PLL's utilized to provide LO signals at the plurality of frequencies while avoiding possible spurs and/or blocker signals. Accordingly, separate PLL's may be used for Tx and Rx functions to allow for greater versatility, for better accommodation of intermediate frequency requirements, to enable zero-exceptions on the Tx spur emission mask, and to handle coexistence issues with GPS, BT, WiFi, and cellular standards, for example. In another embodiment of the invention, the plurality of PLL's may generate clock signals for the ADCs 213A-213D and/or the DACs 237A and 237B.

Figure 3:
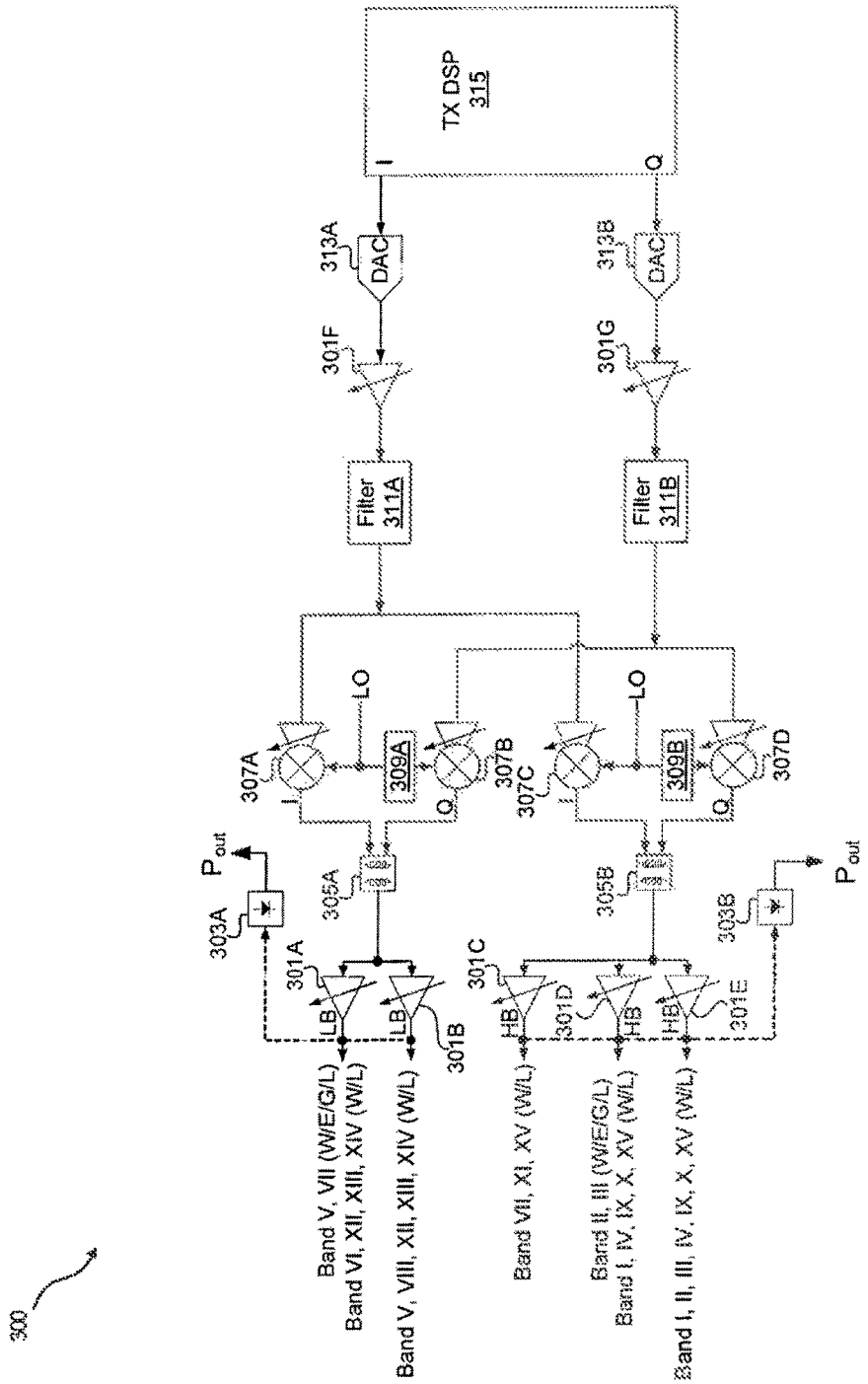
FIG. 3 is a block diagram illustrating an exemplary transmit architecture that may enable coexistence in a multi-band, multi-standard communication system utilizing a plurality of phase locked loops, in accordance with an embodiment of the invention.

FIG. 3 is a block diagram illustrating an exemplary transmit architecture that may enable coexistence in a multi-band, multi-standard communication system utilizing a plurality of phase locked loops, in accordance with an embodiment of the invention. Referring to FIG. 3, there is shown a multi-standard Tx 300 comprising RF PGAs 301A-301G, envelope detectors 303A and 303B, baluns 305A and 305B, mixer/PGAs 307A-307D, 90 degree phase blocks 309A and 309B, filters 311A and 311B, DACs 313A and 313B, and a Tx DSP 315.

The RF PGAs 301A-301E, baseband PGAs 301G-301F and the DACs 313A and 313B may be substantially similar to the amplifiers 207A-207E and the DACs 237A and 237B described with respect to FIG. 2.

The envelope detectors 303A and 303B may comprise diodes, for example, that may enable the detection of the envelope function of the amplified signals at the outputs of the RF PGAs 301A-301E. In this manner, the output power of the multi-standard Tx 300 may be determined, thereby enabling the control of output power via feedback to RF PGAs.

The baluns 305A and 305B may comprise transformers that may be enabled to transform a balanced signal to an unbalanced signal for transmission via an antenna, for example.

The mixer/PGAs 307A-307D may comprise suitable circuitry, logic, and/or code that may enable to up-convert a baseband or IF signal to an RF signal and apply a configurable gain. The mixer/PGAs 307A-307D may receive as inputs an LO signal and a baseband/IF signal to be upconverted.

The mixer/PGAs 307A-307D may comprise IQ upconverters for WCDMA/LTE, IQ/Polar for EDGE and direct (PLL) modulation for GSM. The architecture may comprise multi-mode outputs, such as WCDMA/LTE and GSM/EDGE, for example, at the same outputs, which may enable flexible front-end configuration via multi-standard PAs, legacy PAs, and polar PAs for EDGE.

The 90 degree phase blocks may comprise suitable circuitry, logic, and/or code that may be enabled to provide a phase shift, 90 degrees for example, to a received signal. In this manner, I and Q mixers may receive LO signals from the same source, with one being shifted by 90 degrees.

The filters 311A and 311B may comprise lowpass filters, for reconstruction and smoothing, for example, and may be enabled to filter signals with frequencies outside of a desired band and to allow signals with frequencies within the desired band. The filters 311A and 311B may be configurable filters with a plurality of stages, each of which may be activated or deactivated depending on the type and operational characteristics of filter desired. For example, a 5th order Chebyshev filter with 1 dB ripple may be, utilized for LTE, whereas a 3rd order Butterworth filter may be utilized for GSM/EDGE. In this manner, multiple wireless standards may be transmitted by the same Tx path.

The Tx DSP 315 may comprise suitable circuitry, logic, and/or code that may enable the processing of digital signals via arbitrary functionality defined by user preferences and/or programming. The digital signals may comprise baseband signals, for example, and may represent information to be transmitted via an antenna via the multi-standard Tx 300.

In operation, baseband signals may be processed by the Tx DSP 315 which may generate I and Q signals to be communicated to the DACs 313A and 313B, respectively. The DACs 313A and 313B may convert the received signals to analog signals before communicating them to the baseband PGAs 301F and 301G, which may apply gain to the received signals.

The amplified signals may then be communicated to the filters 311A and 311B where unwanted signals may be filtered out before the desired signals may be communicated to the mixer/PGAs 307A-307D. The filtered signals may then be upconverted to RF signals via the LO signals received by the mixer/PGAs 307A-307D. Each of the mixer/PGAs 307A-307D may upconvert an I or Q signal with an I and a Q signal being communicated to each of the baluns 305A and 305B, which may convert the received signals to an unbalanced signal. The converted signals may be communicated to the RF PGAs 301A-301E. The PGAs 301A-301E may be activated to amplify the desired signal, depending on which standard and/or frequency band may be utilized.

In an embodiment of the invention, the filters 311A and 311B may be configured for the wireless standard being utilized by the multi-standard Tx 300. The order and type may be configured for a specific standard, and also may be configured to bypass one or more stages in a filter to reduce power when desired.

Figure 4:
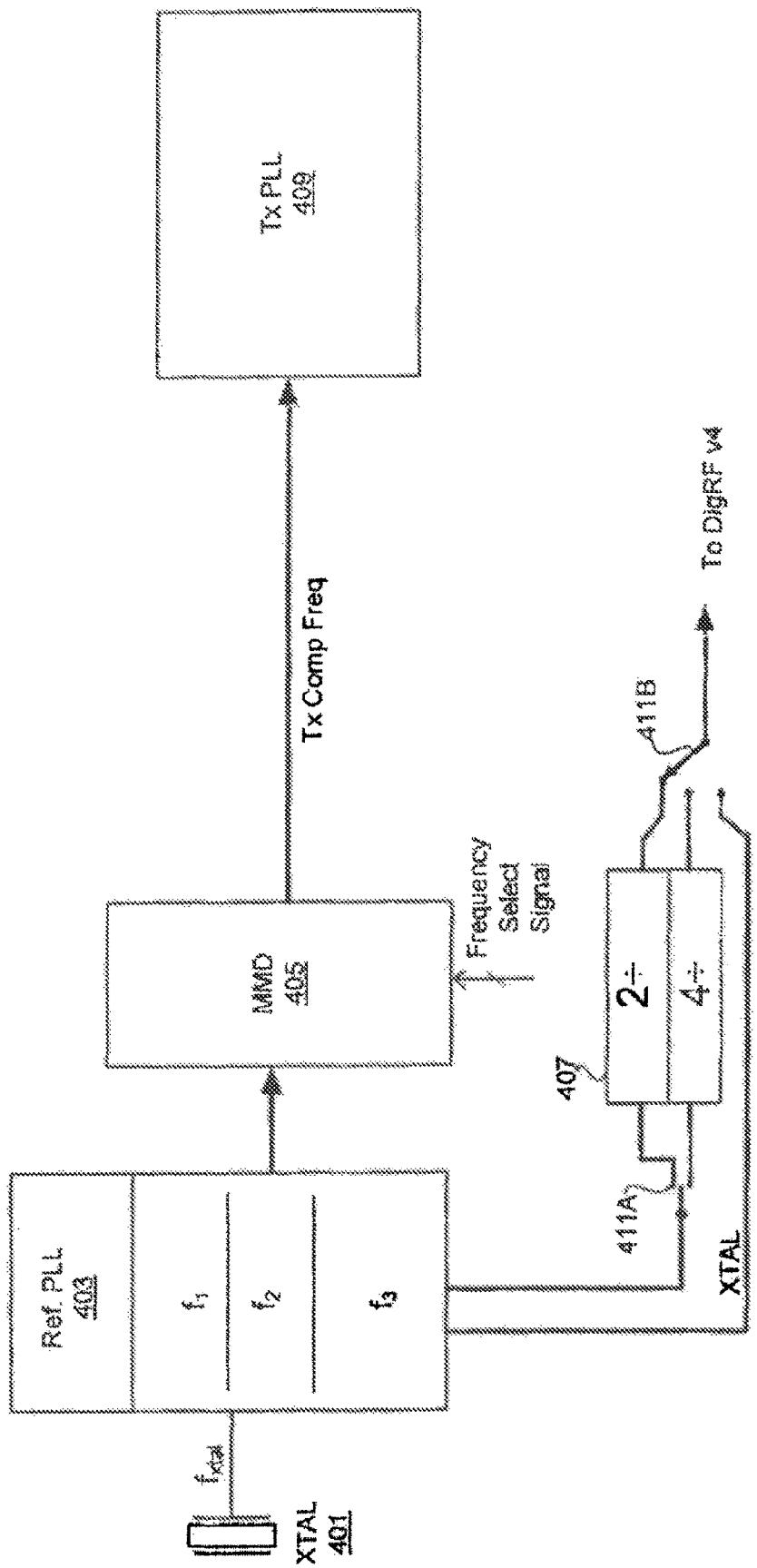
FIG. 4 is a block diagram illustrating a reference phase locked loop configuration, in accordance with an embodiment of the invention.

FIG. 4 is a block diagram illustrating a reference phase locked loop configuration, in accordance with an embodiment of the invention. Referring to FIG. 4, there is shown a reference PLL configuration 400 comprising a crystal oscillator (XTAL) 401, a reference PLL 403, an MMD 405, a divider block 407, a TX PLL 409, and switches 411A and 411B.

The XTAL 401 and MMD 405 may be substantially similar to the XTAL 229 and the MMDs 229A and 229B, respectively, described with respect to FIG. 2. The output of the XTAL 401 may be communicatively coupled to the reference PLL 403.

The reference PLL 403 may comprise suitable circuitry, logic, and/or code that may enable the reception of a reference signal frequency, and locking on to the input frequency to generate a plurality of stable output frequency signals, $f_1$, $f_2$, and f$_3$, depending on the configuration selected. The outputs of the reference PLL 403 may be communicatively coupled to the MMD 405 and the switches 411A and 411B. The Tx PLL 409 may be substantially similar to the reference PLL 403 but may receive an input signal from the MMD 405.

The divider 407 may comprise suitable circuitry, logic, and/or code that may be enabled to divide the frequency of a received signal, such as by 2 or 4, for example, although the invention is not so limited.

The switches 411A and 411B may comprise suitable circuitry, logic, and/or code that may be enabled to select an output frequency. For example, the switch 411A may be enabled to switch a signal received from the reference PLL 403 to the divide-by-2 section or the divide-by-4 section of the divider 407. The switch 411B may be enabled to select between signals from the divide-by-2 sections of the divider 407 or the signal from the XTAL 401 via the reference PLL 403.

In operation, the XTAL 401 may generate a signal at a frequency characteristic of the material of the crystal. The signal may be communicated to the reference PLL 403 which may generate output signals at one or more frequencies. One output signal may be communicated to the MMD 405 which may divide the signal frequency to a desired frequency determined by the appropriate wireless standard being utilized. The divided frequency signal may be communicated to the Tx PLL 409 to enable the transmission of RF signals at a desired frequency.

The switch 411A may be enabled to select an input to receive the output signal of the reference PLL 403. The frequency of the received signal may be divided by 2 or 4, for example, by the divider 407, and the switch 411B may be enabled to select the divided signal or the signal generated by the XTAL 401. The selected signal may be communicated to a digital interface (I/F), used for baseband data exchange between the transceiver and a digital modem. Examples of digital I/Fs comprise DigRF versions v3 and v4, but are not limited to this I/F implementation.

Figure 5:
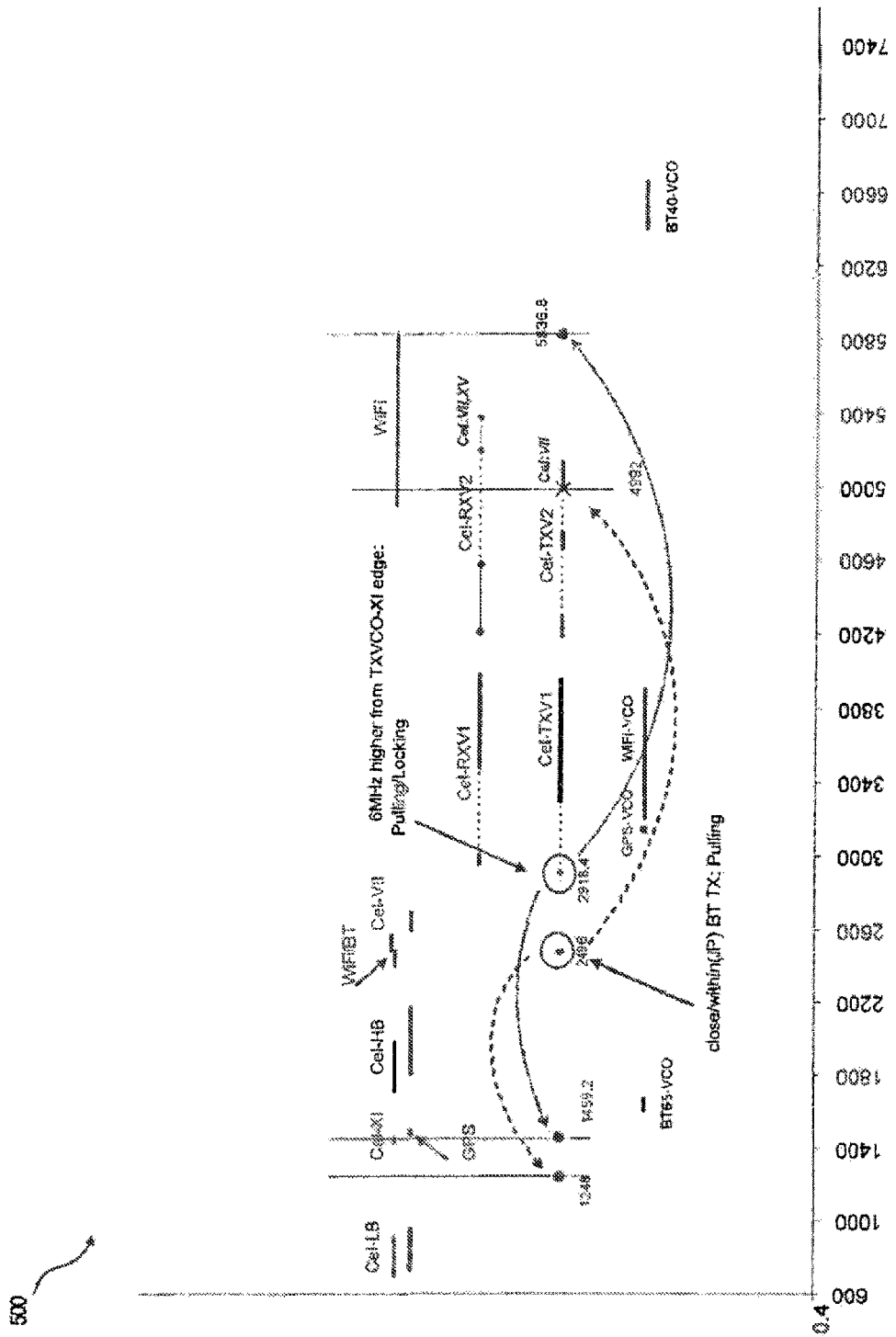
FIG. 5 is a block diagram illustrating exemplary LIE system frequency planning, in accordance with an embodiment of the invention.

FIG. 5 is a block diagram illustrating exemplary LTE system frequency planning, in accordance with an embodiment of the invention. Referring to FIG. 5, there is shown a plurality of wireless bands comprising, wireless LAN, cellular bands, Bluetooth, GPS, and WiFi, for example. In an embodiment of the invention, the LTE radio platform 200 may be operable to configure a plurality of PLL's to operate at desired frequencies while avoiding spurs, or unwanted interfering signals.

For example, the system may be configured for the GPS wireless standard to coexist with other of the cellular standards under operation, such as all cellular bands, W-CDMA, GSM, EDGE from 4G to 1G, while allowing zero exceptions on the Tx spur emission mask. In a wireless system that must conform to a Tx spur mask, frequencies may be planned so as to avoid generating spurs in the unwanted region.

Accordingly, the frequencies utilized in the LTE platform 200 may be configured in order to achieve this requirement, in order to not interfere with other working standards, because exceptions of the standard usually take account only other cellular bands and do not take into account spur emissions in BT, WIMAX, GPS, or Win for example.

In instances where a GPS receiver is integrated on a cellular transceiver die, spurs may be coupled from one system to another. To enable coexistence, it is desirable to have knowledge of operating frequencies of the transceiver for both cellular and other standards. Interactions may comprise effects such as VCO pulling, or receiver desensitization, for example. Since the wireless standards frequencies are fixed, the frequency generation within the wireless device may be configured in order to eliminate such phenomena.

Since the reference PLL or the reference VCO may be used for multiple functions such as to generate the reference frequency for the Tx synthesizer and/or generate clock frequencies for the digital I/F, ADC's, DAC's, and/or other functions, the operating frequency may typically be fixed and may be desirable to produce the least possible interference to all wireless standards. For coexistence on the same die, it may be undesirable to have VCO's operating for different standards at the same or similar frequency, since one VCO may pull the other, and vice-versa.

Referring to FIG. 5, in instances where it is desirable to operate at 1248/1459.2 MHz, for example, it may be very close to GPS band, which in and of itself is not prohibitive, but it will be advantageous to move away from GPS receive band. Thus, the 2× frequency, or 2496/2918.4 MHz may be utilized. In that case: i) the 2918.4 MHz frequency is within the Tx VCO operating range and may create pulling phenomena between the Reference and the Tx VCo's. It may also degrade the locking time of the complete TX path and ii) the 2496 MHz is close/within the Japan BT operating band which is also undesirable. A favorable case may be to double the operating frequency of the Reference VCO resulting in 4992/5836.8 MHz. At this frequency range there is some overlap with the WiFi (802.11a) operating frequencies. But due to weaker electromagnetic coupling at these high frequencies, a careful physical implementation can help to overcome problems like the ones described above and allow for simultaneous operation of both the Reference VCO and the 802.11a wireless standard.

The reference frequency of the Tx synthesizer may comprise a significant generator of spurs, in that the output produces harmonics of its reference frequency. So, for example, in instances where it operates from a 26 MHz crystal, at the output there may be spurs at 26 MHz spacing, or harmonics of the reference frequency. One way to avoid these spurs, which relates to exceptions, may be to increase the reference frequency. If this reference frequency is very large, 300 MHz, for example, then spurs may occur at the output every 300 MHz which may be spaced far enough to not cause violation of the Tx spur emission mask as described by the relevant communication protocol. Thus, by increasing the reference frequency of the Tx synthesizer, spurs may be reduced drastically.

There may exist degrees of freedom to move the frequency generation depending on the operating band in a given region, such as in North America versus Japan or Europe. If a device may be configured for Europe for particular wireless bands different from North America, so the system may be configured for the different set of bands because certain requirements have changed from one system to the other. Accordingly, the system may be adapted to the best operating environment, to adapt in the best way to the operating environment at the time. For example, a multi-band, multi-standard mobile phone may be capable of utilizing, different standards anywhere in the world. Accordingly, the device would determine its location and then configure itself as a user moves from North America to Japan on a business trip, for example. Similarly, the multi-band, multi-standard mobile phone may be capable of dynamically determining the presence of expected spurs and/or blocker signals based on the location of the multi-band, multi-standard mobile phone.

Figure 6:
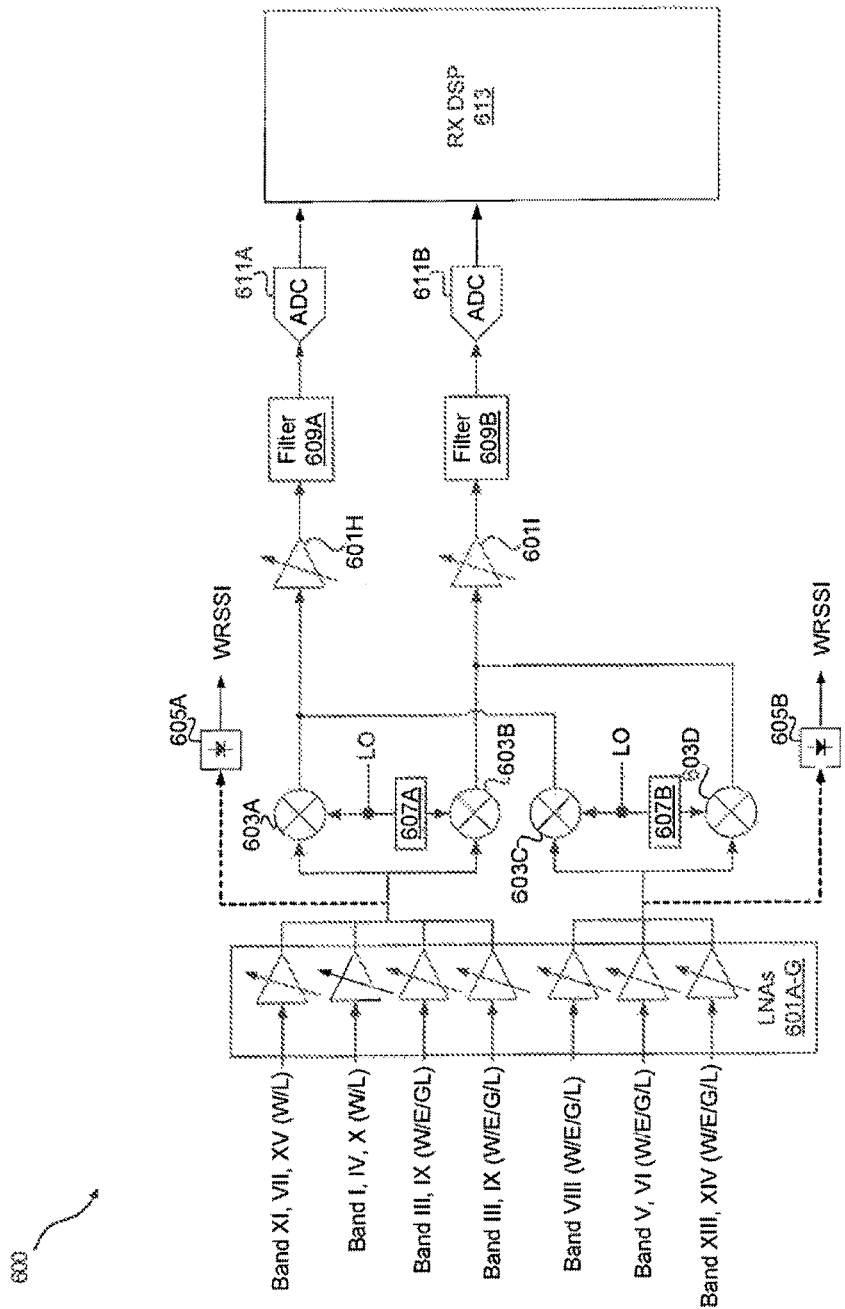
FIG. 6 is a block diagram illustrating an exemplary receive architecture, in accordance with an embodiment of the invention.

FIG. 6 is a block diagram illustrating an exemplary receive architecture, in accordance with an embodiment of the invention. Referring to FIG. 6, there is shown a multi-standard Rx 600 comprising LNAs 601A-601G, mixers 603A-603D, envelope detectors 605A and 605B, 90 degree phase blocks 607A and 607B, filters 609A and 609B, ADCs 611A and 611B, and an Rx DSP 613.

The LNAs 601A-601G, the mixers 603A-603D, the envelope detectors 605A and 605B, the 90 degree phase blocks 607A and 607B, the filters 609A and 609B, and the ADCs 611A and 611B may be substantially similar to the LNAs 209A-209W, the envelope detectors 603A and 603B, the 90 degree phase blocks 609A and 609B, the filters 611A and 611B, and the ADCs 213A-213D described with respect to FIGS. 2 and 6.

The Rx DSP 613 may comprise suitable circuitry, logic, and/or code that may enable the processing of digital signals via arbitrary functionality defined by user preferences and/or programming. The digital signals may comprise baseband signals, for example, and may represent information received by the multi-standard Rx 600.

In operation, RF signals from one or more of a plurality of wireless standards may be received by the multi-standard Rx 600 via an antenna, such as the antenna 201A, for example, described with respect to FIG. 2. The received signals may be amplified the LNAs 601A-601G, depending on the frequency band or wireless standard of the received signal, before being down-converted by the mixers 603A-603D.

The mixers 603A-603D may down-convert the amplified signals and by utilizing the 90 degree phase blocks, may generate I and Q signals. The I and Q signals may be amplified by the PGAs 601H and 601I before being filtered by the filters 609A and 609B. The filtered signals may then be communicated to the ADCs 611A and 611B to be converted to digital signals that may be processed by the Rx DSP 613.

The envelope detectors 605A and 605B may measure the received signal, or wideband received signal strength indicator (WRSSI), which may be utilized to control the gain of the LNAs 601A-601G, and may also be utilized to determine the presence of blocker signals. In this manner, in instances where a blocker signal is present, the gain of the appropriate LNA 601A-601G may be reduced. In addition, the linearity of the multi-standard Rx 600 may be configured by monitoring the WRSSI and adjusting the gain of the LNAs 601A-601G.

In an embodiment of the invention, the filters 609A and 609B may be configured for the wireless standard being utilized by the multi-standard Rx 600. The order and type of the filter being utilized may be configured for a specific standard, and also may be configured to bypass one or more stages in the filter to reduce power when desired. In another embodiment of the invention, the multi-standard Rx 600 current may be scaled in the absence of blocker signals to optimize the desired received signal.

The multi-standard Rx 600 may comprise a low IF for EDGE/GSM and direct conversion capability for WCDMA/LTE, and may comprise reconfigurable BB filters and ADCs. The multi-standard Rx 600 may enable linearity on demand via Rx current scaling in the absence of blockers, for example.

The multi-standard Rx 600 may comprise a plurality of HB and LB LNAs comprising the LNAs 601A-601G, that may drive the plurality of HB and LB mixers, the mixers 603A-603D. The LNAs 601A-601G may comprise common-source cascode technology, for example, and may provide fine and coarse gain steps via current steering.

Figure 7:
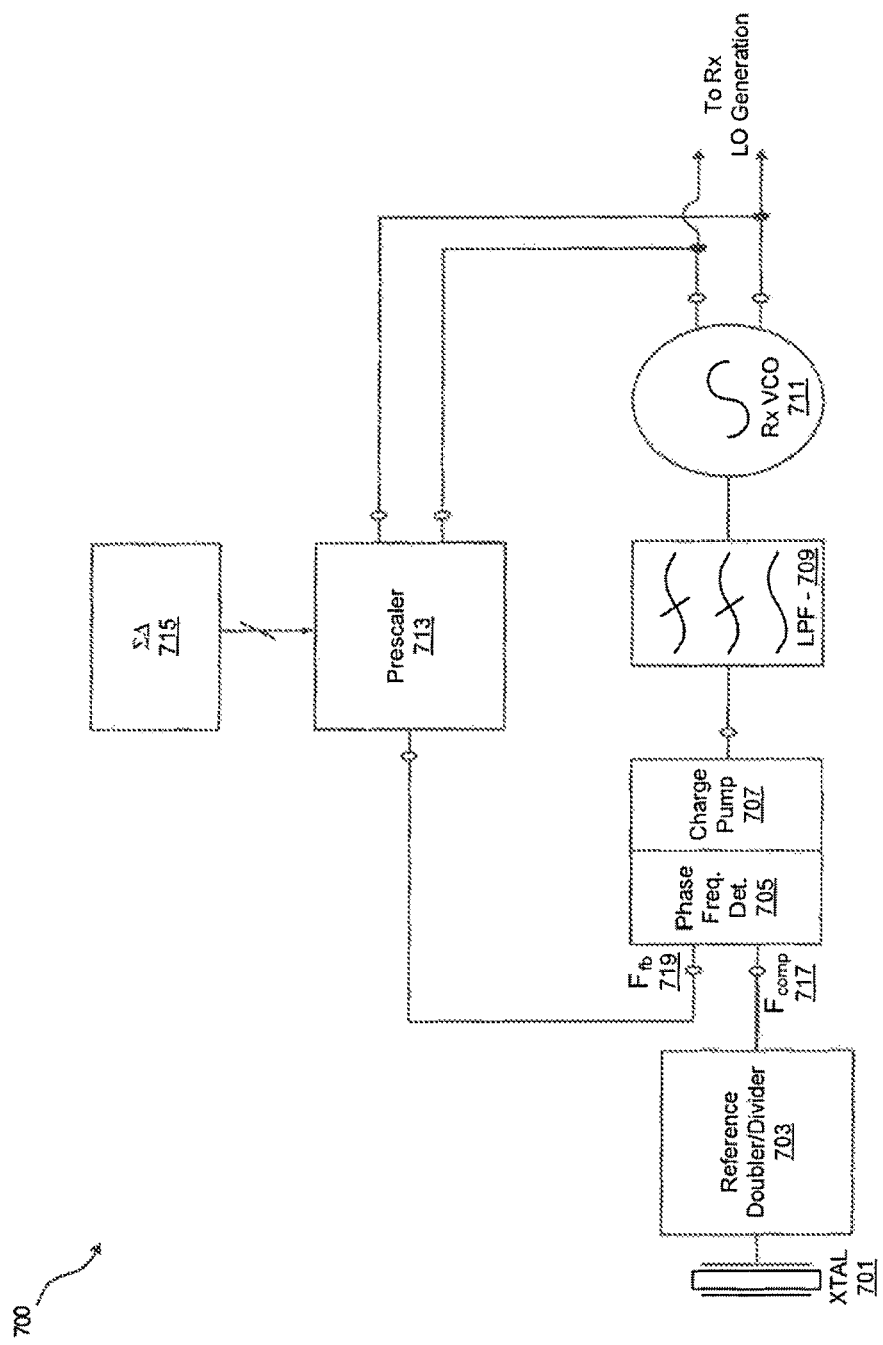
FIG. 7 is a block diagram of an exemplary Rx phase-locked loop, in accordance with an embodiment of the invention.

FIG. 7 is a block diagram of an exemplary Rx phase-locked loop, in accordance with an embodiment of the invention. Referring to FIG. 7, there is shown an Rx PLL 700 comprising an XTAL 701, a reference doubler/divider 703, a phase/frequency detector (PFD) 705, a charge pump 707, a low-pass filter (LPF) 709, an Rx VCO, a prescaler 713, and a sigma-delta modulator 715. There is also shown signals $F_{comp}$ 717 and $F_{fb}$ 719.

The XTAL 701 may be substantially similar to the XTAL 401, described with respect to FIG. 4. The reference doubler/divider 703 may comprise suitable circuitry, logic, and/or code that may double or divide the frequency of the signal received from the XTAL 701. The output of the reference doubler/divider 703 may be communicatively coupled to an input of the PFD 707.

The PFD 705 may comprise suitable logic, circuitry, and/or code that may enable generation of one or more signals based on a phase difference between two signals. In this regard, the signals generated by the reference doubler/divider 703 and the prescaler 713 may be input to the phase PFD 705 with the output of the PFD communicatively coupled to the charge pump 707.

The charge pump 707 may comprise suitable logic, circuitry, and/or code that may enable generation of an error signal based on signals received from the reference doubler/divider 703 and the prescaler 713. The output of the charge pump 707 may be a function of the phase difference by the signals received by the PFD 705.

The Rx VCO 711 may comprise suitable logic, circuitry, and/or code that may enable generation of output signals at a frequency proportional to the output signal generated by the charge pump 707. The Rx VCo 711 may be enabled to generate two output signals that may be I and Q signals for Rx LO generation.

The prescaler 713 may comprise suitable circuitry, logic, and/or code that may enable dividing the frequency of the output signals of the VCO 711. In this manner, a feedback signal, $F_{fb}$, may be communicated to the PFD 707 for comparison to the output of the reference doubler/divider 703, $F_{comp}$ 717. The divisor of the prescaler 713 may be configured by a signal received from the sigma-delta modulator 715, which may comprise suitable circuitry, logic, and/or code that may be enabled to receive a digital signal and generate an analog output signal. The sigma-delta modulator 715 may be enabled to control the frequency of the Rx PLL 700 by enabling the configuring the feedback signal $F_{fb}$ 719.

In operation, the XTAL 710 may generate a reference frequency signal that may be doubled/divided by the reference doubler/divider 703 to generate a comparison signal, $F_{comp}$ 717, that may be communicated to the PFD 707. The PFD 705 may compare $F_{comp}$ 717 to the feedback signal $F_{FB}$ 719 to determine whether the Rx VCO 711 needs an increase or decrease in frequency. In instances where the PFD 705 determines that the feedback signal $F_{FB}$ 719 is lower or higher in frequency than $F_{comp}$ 717, the charge pump 707 may increase an output signal proportional to the frequency difference between $F_{comp}$ 717 and $F_{FB}$ 719, which may be filtered by the LPF 709 to allow a DC signal to pass to the Rx VCO 711. An increase in the signal received by the Rx VCO 711 may increase the frequency of the Rx VCO 711, which may be utilized for Rx LO generation.

Figure 8A:
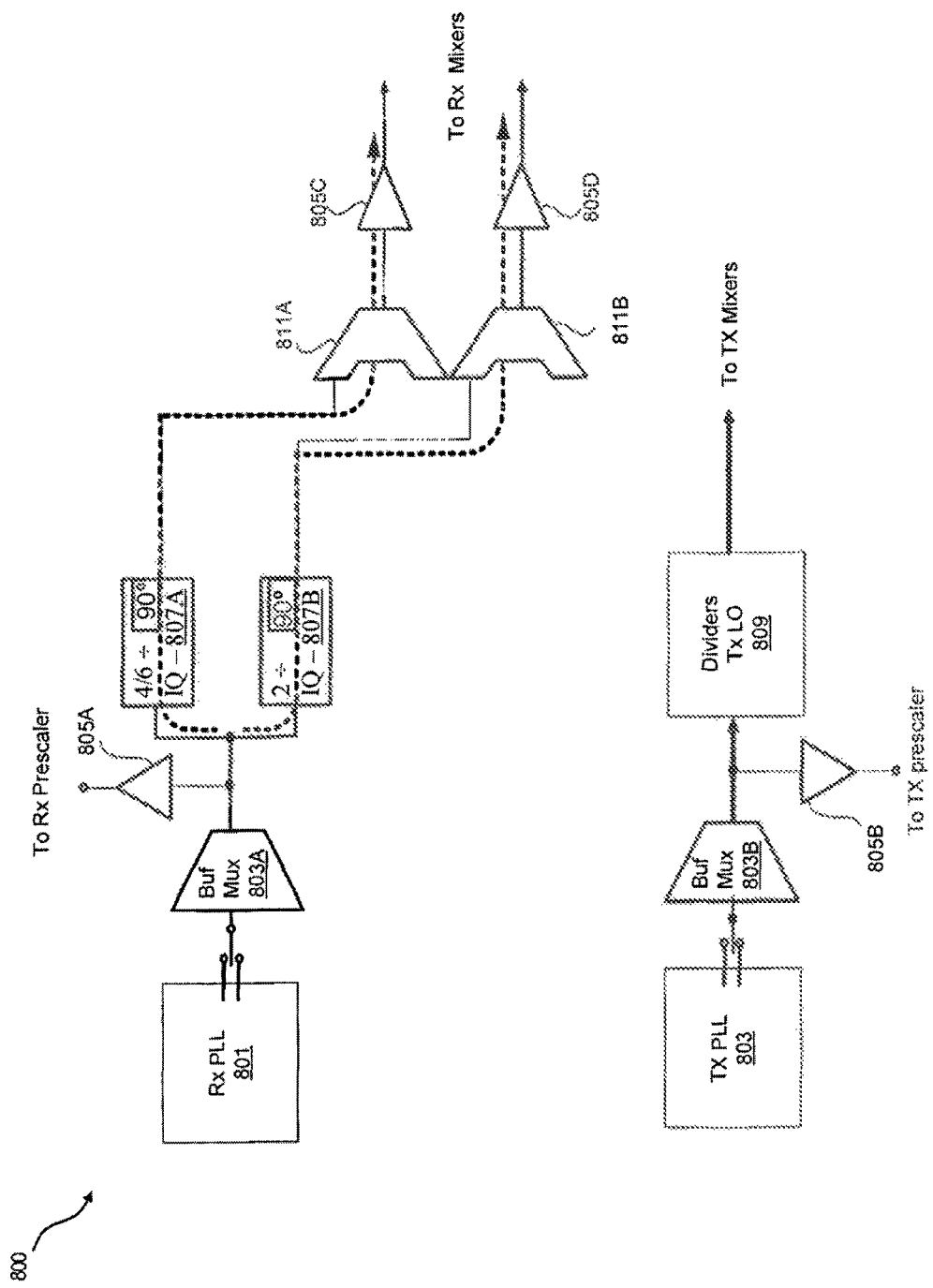
FIG. 8A is a block diagram of an exemplary frequency division duplex local oscillator generation configuration, in accordance with an embodiment of the invention.

FIG. 8A is a block diagram of an exemplary frequency division duplex local oscillator generation configuration, in accordance with an embodiment of the invention. Referring to FIG. 8A, there is shown an Rx/Tx LO 800 comprising an Rx PLL 801, buffer multiplexers 803A and 803B, amplifiers 805A-805D, IQ dividers 807A and 807B, TX LO divider block 809, and multiplexers 811A and 811B.

The Rx PLL 801 may be substantially similar to the Rx PLL 700 described with respect to FIG. 7, and may be enabled to lock onto a received signal and generate a stable signal at a desired frequency. The Tx PLL 803 may be substantially similar to the Tx PLL 609 described with respect to FIG. 6, and may be enabled to lock onto a received signal and generate a stable signal at a desired frequency. The Rx PLL 801 and the Tx PLL 803 may be enabled to generate a plurality of output signals.

The buffer multiplexers 803A and 803B may comprise suitable circuitry, logic, and/or code that may be enabled to select a desired input signal that may be utilized to generate an output signal and may provide a buffer between the Rx PLL 801 and the Tx PLL 803 with subsequent circuitry to alleviate loading.

The amplifiers 805A-805D may comprise suitable circuitry, logic, and/or code that may be enabled to amplify a received signal at a desired gain level.

The IQ dividers 807A and 807B may comprise suitable circuitry, logic, and/or code that may enable the generation of signals for I and Q signal generation. Accordingly, output signals from the IQ dividers 807A and 807B may be 90 degrees out of phase, and may be at a frequency that is an integer divisor of the received signal, divided by 2, 4, or 6, for example. In this manner, I and Q signals may be decoded from signals received by the LTE radio platform 200 in the mobile terminal 120.

The Tx LO divider block 809 may comprise suitable circuitry, logic, and/or code that may enable the reduction of frequency of a received signal by an integer factor. In this manner, a plurality of frequencies may be obtained to be communicated to Tx, mixers from a given input signal frequency.

The multiplexers 811A and 811B may comprise suitable circuitry, logic, and/or code that may enable the selection of one of a plurality of input signals to be communicated to an output of the multiplexer. In this manner, a plurality of PLL configurations may be utilized to provide signals for Tx and Rx mixers. For example, the signal generated by the Tx PLL 803 may also be utilized by Rx mixers, by routing the signal to the multiplexers 811A and 811B, as described with respect to FIG. 8B

In operation, separate PLLs, the Rx PLL 801 and the Tx PLL 803 may be utilized to generate signals of desired frequencies for Rx and Tx mixing. In an exemplary embodiment of the invention, the Rx PLL 801 may generate a plurality of signals at different frequencies. The buffer multiplexer 803A may select the desired frequency signal generated by the Rx PLL 801 and communicate the buffered signal to the amplifier 805A and the IQ dividers 807A and 807B.

The IQ dividers 807A and 807B may divide the frequency of the received signal by an integer, and generate I and Q signals to be communicated to the multiplexers 811A and 811B. The outputs of the multiplexers 811A and 811B may be communicated to the amplifiers 805C and 805D, respectively, before being communicated to mixers, such as the mixers 211A-211D described with respect to FIG. 2.

The Tx PLL 803 may generate a plurality of signals at different frequencies. The buffer multiplexer 803B may select the desired frequency signal generated by the Tx PLL 803 and communicate the buffered signal to the amplifier 805B and the Tx LO divider block 809. The frequency-divided signal may then be communicated to one or more mixers, such as the mixers 211E and 211F, described with respect to FIG. 2.

Figure 8B:
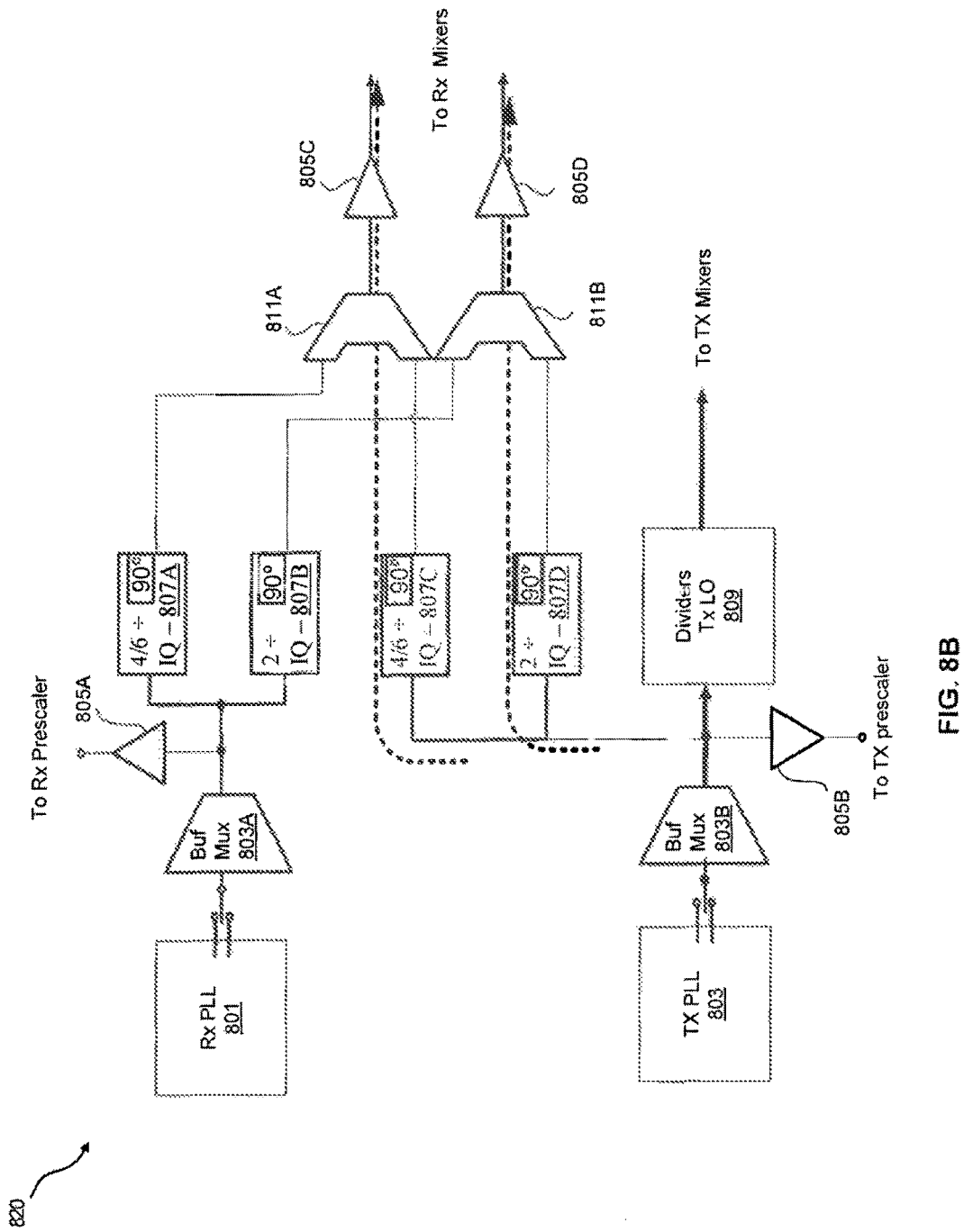
FIG. 8B is a block diagram of an exemplary time division duplex local oscillator generation configuration, in accordance with an embodiment of the invention.

In frequency division duplex (FDD) mode, both the Rx PLL 801 and the Tx PLL 803 may be utilized to generate signals for mixing of signals, as opposed to time division duplex (TDD) mode, where the Tx PLL 803 may be utilized to generate the signals for both Rx and Tx mixing, as described further with respect to FIG. 8B.

FIG. 8B is a block diagram of an exemplary time division duplex local oscillator generation configuration, in accordance with an embodiment of the invention. FIG. 8B illustrates an Rx/Tx LO 820, which may be substantially similar to the Rx/Tx LO 800 of FIG. 8A, but with the addition of the IQ dividers 807C and 807D, which may substantially similar to IQ dividers 807A and 807B, but configured to receive signals from the Tx PLL 803 via the buffer multiplexer 803B.

In operation, the Tx PLL 803 may generate a plurality of signals at different frequencies. The buffer multiplexer 803B may select the desired frequency signal generated by the Tx PLL 803 and communicate the buffered signal to the amplifier 805B, the Tx LO divider block 809, and the IQ dividers 807C and 807D. In TDD mode, the Tx PLL 803 may provide a signal for both Rx and Tx mixers, but alternating in time. In instances where the Tx PLL 803 may be providing a signal for Rx mixers via the multiplexers 811A and 8116 and the amplifiers 805C and 805D, the Tx LO divider block 809 may be disabled, or powered down to reduce excess power consumption. Similarly, when the Tx PLL 803 may provide a signal for Tx mixing, the IQ dividers 807C and 807D, the multiplexers 811A and 8118 and the amplifiers 805C and 805D may be disabled or powered down to reduce excess power consumption.

By utilizing the configurable PLL system shown in FIGS. 8A and 8B, transient phenomena may be avoided during power-up/down of PLL's and VCO's, such as from the change of device characteristics from cold-to-hot and spikes on sensitive power supply lines. Additionally, slow DC-state settling may prevent slot-operation if alternate between PLL's, and as such, PLL's may not completely power-down. Furthermore, the high frequency Fcomp of the TX PLL may be utilized to avoid XTAL harmonics in the Rx LO that can down-convert blockers inside the signal bandwidth.

Figure 9:
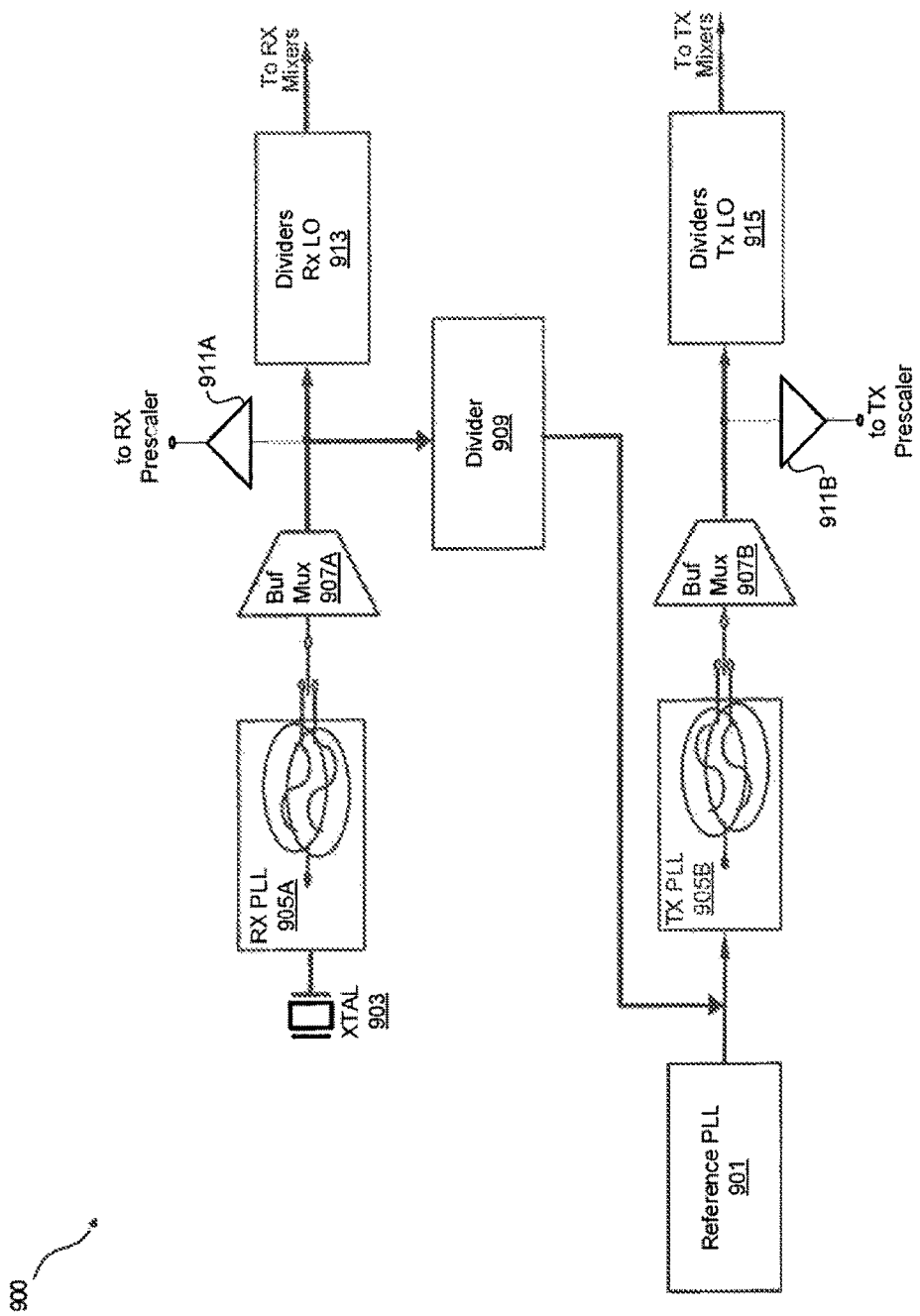
FIG. 9 is a block diagram of an exemplary Tx LO configuration, in accordance with an embodiment of the invention.

FIG. 9 is a block diagram of an exemplary Tx LO configuration, in accordance with an embodiment of the invention. Referring to FIG. 9, there is shown a Tx LO 900 comprising a reference PLL 901, an XTAL 903, an Rx PLL 905A, a Tx PLL 905B, buffer multiplexers 907A and 907B, amplifiers 911A and 911B, Rx Lo dividers 913, and Tx LO dividers 915.

The reference PLL 901, the XTAL 903, the Rx PLL 905A, the Tx PLL 905B, the buffer multiplexers 907A and 907B, the divider 909, the amplifiers 911A and 911B, the Rx LO dividers 913, and the Tx LO dividers 915 may be substantially similar to the reference PLL 403, the XTAL 401, the Rx PLL 801, the Tx PLL 803, the buffer multiplexers 803A and 803B, the amplifiers 805A and 805B, the IQ dividers 807A and 807B, and the Tx LO divider block 809.

The divider 909 may comprise suitable circuitry, logic, and/or code that may enable dividing the frequency of the signal generated by the buffer multiplexer 907A and communicating the reduced frequency signal to an input of the Tx PLL 905B. The divider 909 may comprise a multi-modulus divider (MMD) and may enable the adjustment of harmonics of the reference frequency to zero exceptions.

In an embodiment, of the invention, there may be no fixed relationship between the Rx and Tx VCO frequencies within the Rx PLL 905A and the Tx PLL 905B. In an embodiment of the invention, the Rx PLL 905A may provide a reference frequency signal to both the Rx and Tx side, with the divider 909 dividing the frequency of the signal communicated to the Tx PLL 905B. Accordingly, the reference PLL 901 may be powered down or put in a low power state to reduce power consumption.

Figure 10:
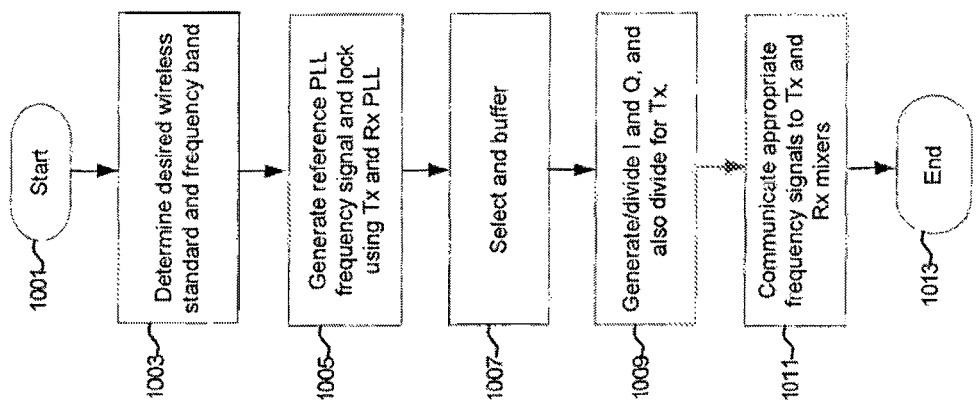
FIG. 10 is a flow diagram illustrating exemplary steps enabling coexistence in a multiband, multistandard communication system utilizing a plurality of phase locked loops, in accordance with an embodiment of the invention.

FIG. 10 is a flow diagram illustrating exemplary steps enabling coexistence in a multiband, multistandard communication system utilizing a plurality of phase locked loops, in accordance with an embodiment of the invention. In step 1003, after start step 1001, the desire wireless standard and associated frequency requirements may be determined, followed by step 1005, where the desired frequency or frequencies are utilized to generate a reference PLL signal from a crystal, XTAL 401, for example. The reference signal may be locked on to utilizing Tx and Rx PLLs, 801 and 803, followed by step 1007 where the locked frequencies may be selected by buffer multiplexers 803A and 803B. In step 1009, the selected frequency signals may be divided to generate I and Q signals by IQ dividers 807A-807D and/or divided by MMD dividers 809/909, for example. In step 1011, the divided signals may be communicated to Rx and Tx mixers, followed by end step 1013.

In an embodiment of the invention, a method and system is described for determining one or more desired frequencies of operation of a wireless transmitter and wireless receiver. A frequency of one or more spurs, intermodulation, and/or mixing product signals may be determined based on one or both of the determined desired frequencies of operation and on one or more other frequencies being utilized at a location of the multi-band, multi-standard wireless transmitter and wireless receiver. A plurality of phase locked loops may be configured to operate at a multiple of the desired frequencies of operation while avoiding the one or more spurs, intermodulation, and/or mixing product signals. The desired frequencies of operation may be generated utilizing integer dividers, which may comprise multi-modulus dividers. The wireless standards in the multi-band, multi-standard wireless transmitter and wireless receiver comprise LTE, GSM, EDGE, GPS, Bluetooth, WiFi, and/or WCDMA, for example. The desired frequencies of operation may be configured to mitigate interference between the wireless standards. Phase locked loops may be shared, when the wireless transmitter and wireless receiver operate in time-division duplex mode, and separate phase locked loops may be utilized when the wireless transmitter and wireless receiver operate in frequency-division duplex mode. One or more clock signals may be generated for operation of digital interfaces, such as, but not limited to DigRF versions 3 and/or 4, utilizing one or more of the plurality of phase locked loops. Zero exceptions may be generated on a transmitter spur emission mask utilizing the plurality of phase locked loops. Sampling clocks may be generated for analog to digital converters and/or digital to analog converters in the wireless multi-band, multi-standard wireless transmitter and wireless receiver.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for coexistence in a multiband, multistandard communication system utilizing a plurality of phase locked loops.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A wireless device, comprising:
   a processor configured to determine an operating frequency of the wireless device and a frequency of an interfering emission including a spur, an intermodulation signal, or a mixing product signal; and
   a frequency synthesizer configured to generate an operating signal at the operating frequency using a reference signal frequency, wherein the processor is further configured to adjust the reference signal frequency to mitigate the interfering emission.

2. The wireless device of claim 1, further comprising:
   a phased-locked loop (PLL) configured to generate a plurality of PLL signals, wherein the reference signal frequency is proportional to a frequency of a first PLL signal from among the plurality of PLL signals.

3. The wireless device of claim 2, further comprising:
   a divider configured to divide the frequency of the first PLL signal to provide the reference signal frequency.

4. The wireless device of claim 3, wherein the divider is a multi-modulus divider (MMD).

5. The wireless device of claim 4, wherein the processor is further configured to set a divisor for the MMD according to the operating frequency.

6. The wireless device of claim 1, wherein the frequency synthesizer comprises:
   a transmit phased-locked loop (PLL) configured to provide a transmit frequency for the operating signal, wherein the operating signal is used for transmission by the wireless device.

7. A wireless device, comprising:
a receive phased locked loop (PLL) configured to provide a plurality of signals;
a transmit PLL configured to utilize a reference signal frequency; and
a processor configured to:
select a first signal in the plurality of signals for communication functions,
determine a frequency of an interfering emission including a spur, an intermodulation signal, or a mixing product signal, and
adjust the reference signal frequency to mitigate the interfering emission.

8. The wireless device of claim 7, further comprising:
a receive multiplexer configured to provide the first signal according to an operating frequency of the wireless device.

9. The wireless device of claim 7, further comprising:
a divider configured to divide the first signal to provide the reference signal.

10. The wireless device of claim 9, further comprising:
a reference PLL configured to provide an operating reference signal, wherein the transmit PLL is further configured to provide a plurality of second signals utilizing a frequency of the reference signal or the operating reference signal.

11. The wireless device of claim 10, wherein the reference PLL is further configured to operate in a low-power or a shutdown mode when the transmit PLL utilizes the reference signal.

12. The wireless device of claim 7, further comprising:
a transmit multiplexer configured to provide the reference signal according to a frequency of operation of the wireless device.

13. The wireless device of claim 7, further comprising:
a receive multiplexer configured to provide the first signal according to a frequency of operation of the wireless device;
a transmit multiplexer configured to provide the reference signal according to the frequency of operation of the wireless device; and
a receive divider and a transmit divider configured to mix the first signal and the reference signal, respectively, to provide receive and transmit mixer input signals.

14. The wireless device of claim 9, wherein the divider is a multi-modulus divider (MMD).

15. In a wireless device, a method comprising:
determining a frequency of an interfering emission including a spur, an intermodulation signal, or a mixing product signal according to a desired frequency of operation of the wireless device;
adjusting a frequency of a reference signal based on the interfering emission; and
generating an operating signal at the desired frequency of operation using the frequency of the reference signal.

16. The method of claim 15, wherein the frequency of the reference signal is frequency divided to provide a frequency of an input signal.

17. The method of claim 15, wherein the desired frequency of operation is determined by a location of the wireless device.

18. The wireless device of claim 1, wherein the processor is configured to determine the frequency of the interfering emission based on a location of the wireless device.

19. The wireless device of claim 7, wherein the processor is configured to determine the frequency of the interfering emission based on a location of the wireless device.

20. The method of claim 15, further comprising:
configuring a plurality of phase locked loops to operate at frequencies that are proportional to the desired frequency of operation and to avoid the interfering emission.

* * * * *